United States Patent
Villamor

(10) Patent No.: US 11,942,327 B2
(45) Date of Patent: Mar. 26, 2024

(54) SINGULATION OF SILICON CARBIDE SEMICONDUCTOR WAFERS

(71) Applicant: SEMICONDUCTOR COMPONENTS INDUSTRIES, LLC, Phoenix, AZ (US)

(72) Inventor: Aira Lourdes Villamor, Lapu-Lapu (PH)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 50 days.

(21) Appl. No.: 17/659,388

(22) Filed: Apr. 15, 2022

(65) Prior Publication Data

US 2022/0238343 A1    Jul. 28, 2022

Related U.S. Application Data

(62) Division of application No. 15/974,984, filed on May 9, 2018, now Pat. No. 11,309,188.

(51) Int. Cl.
  *H01L 21/00* (2006.01)
  *H01L 21/304* (2006.01)
  *H01L 29/16* (2006.01)

(52) U.S. Cl.
  CPC ...... *H01L 21/3043* (2013.01); *H01L 29/1602* (2013.01); *H01L 29/1608* (2013.01)

(58) Field of Classification Search
  CPC ............. H01L 21/3043; H01L 29/1602; H01L 29/1608

(Continued)

(56) References Cited

U.S. PATENT DOCUMENTS

| 6,136,668 A | 10/2000 | Tamaki et al. |
| 2005/0156325 A1* | 7/2005 | You Yang ............... H01L 24/83 257/E21.51 |

(Continued)

FOREIGN PATENT DOCUMENTS

| CN | 103681982 A | 3/2014 |
| CN | 103878892 A | 6/2014 |

(Continued)

OTHER PUBLICATIONS

China National Intellectual Property Administration, First Office Action, Chinese Application for Invention No. 201910381948.9, dated May 9, 2019.

(Continued)

*Primary Examiner* — Caleb E Henry
*Assistant Examiner* — Dilinh P Nguyen
(74) *Attorney, Agent, or Firm* — Brake Hughes Bellermann LLP

(57) ABSTRACT

A method of singulating a silicon carbide (SiC) semiconductor wafer can include defining a cut within the silicon carbide (SiC) semiconductor wafer by performing a partial dicing operation where the SiC semiconductor wafer is aligned along a plane and the cut has a depth less than a first thickness of the SiC semiconductor wafer. The cut is aligned along a vertical direction orthogonal to the plane such that a portion of the SiC semiconductor wafer has a second thickness that extends between a bottom of the cut and an outer surface of the SiC semiconductor wafer. The method can further include defining a cleave, by performing a cleaving operation, through the portion of the SiC semiconductor wafer having the second thickness. The cleave can be aligned with the cut and extending to the outer surface of the SiC semiconductor wafer.

20 Claims, 6 Drawing Sheets

(58) Field of Classification Search
USPC .......................................................... 438/77
See application file for complete search history.

(56) References Cited

U.S. PATENT DOCUMENTS

| | | | |
|---|---|---|---|
| 2012/0315739 A1 | 12/2012 | Hashii et al. | |
| 2016/0336473 A1* | 11/2016 | Rana | H01L 31/1864 |
| 2018/0166328 A1* | 6/2018 | Tang | H01L 24/11 |

FOREIGN PATENT DOCUMENTS

| | | | |
|---|---|---|---|
| CN | 104377275 A | | 2/2015 |
| CN | 105226143 A | | 1/2016 |
| KR | 10-2004-0099170 | * | 11/2004 |
| WO | 2017221577 A1 | | 12/2017 |

OTHER PUBLICATIONS

U.S. Appl. No. 15/974,984, filed May 9, 2018, Allowed.

* cited by examiner

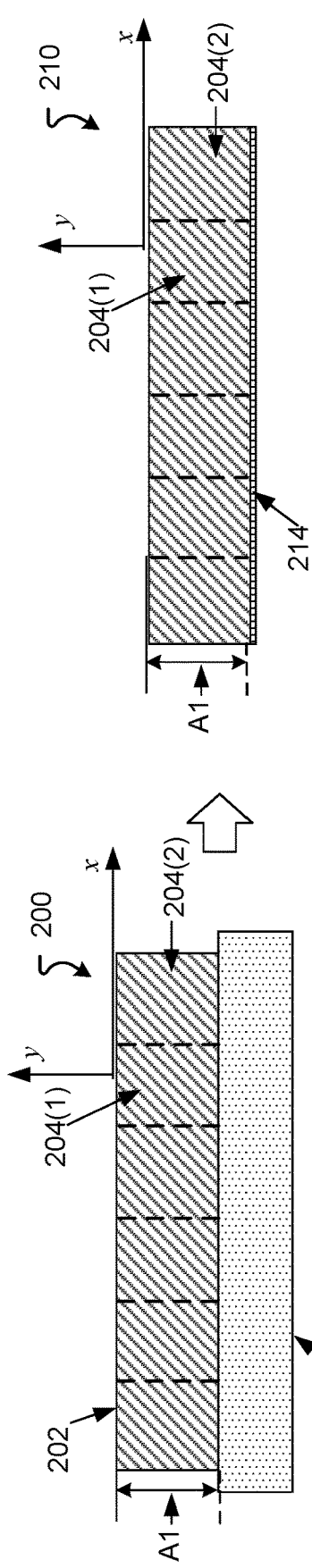
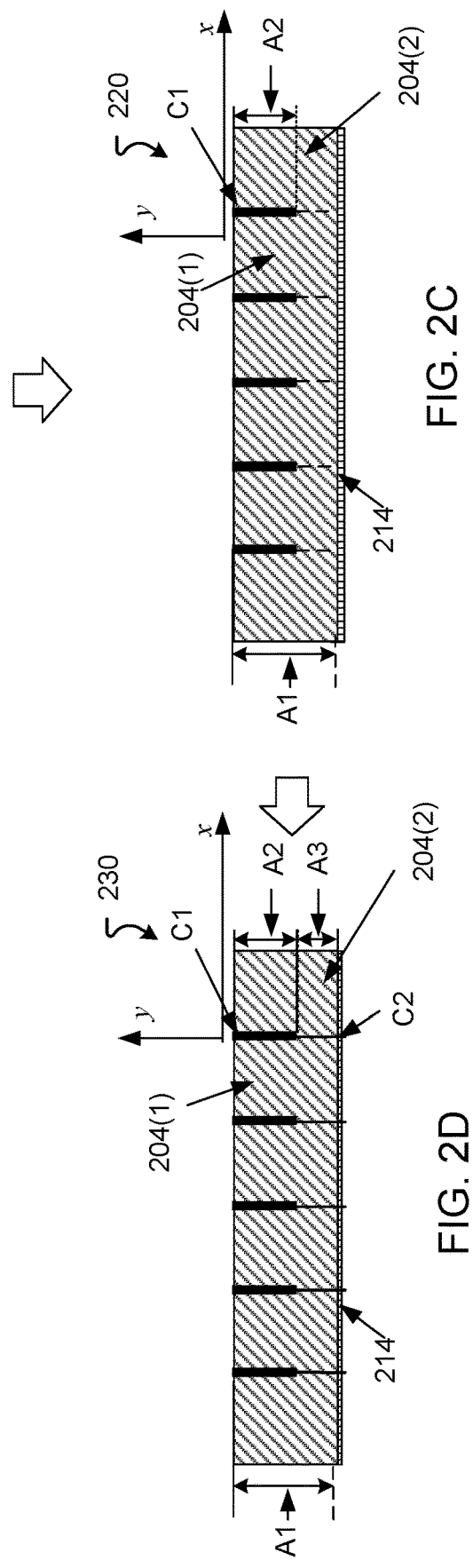

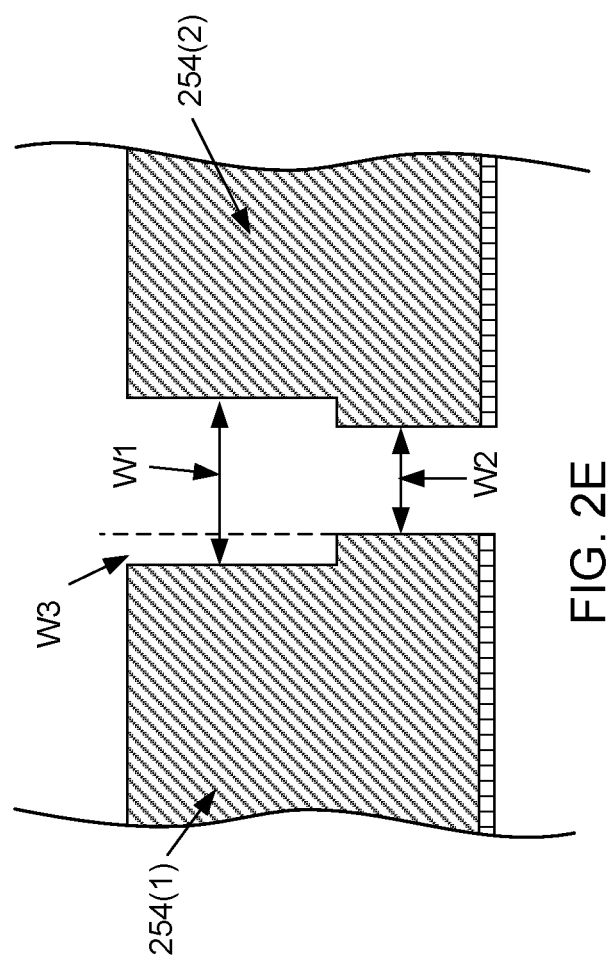

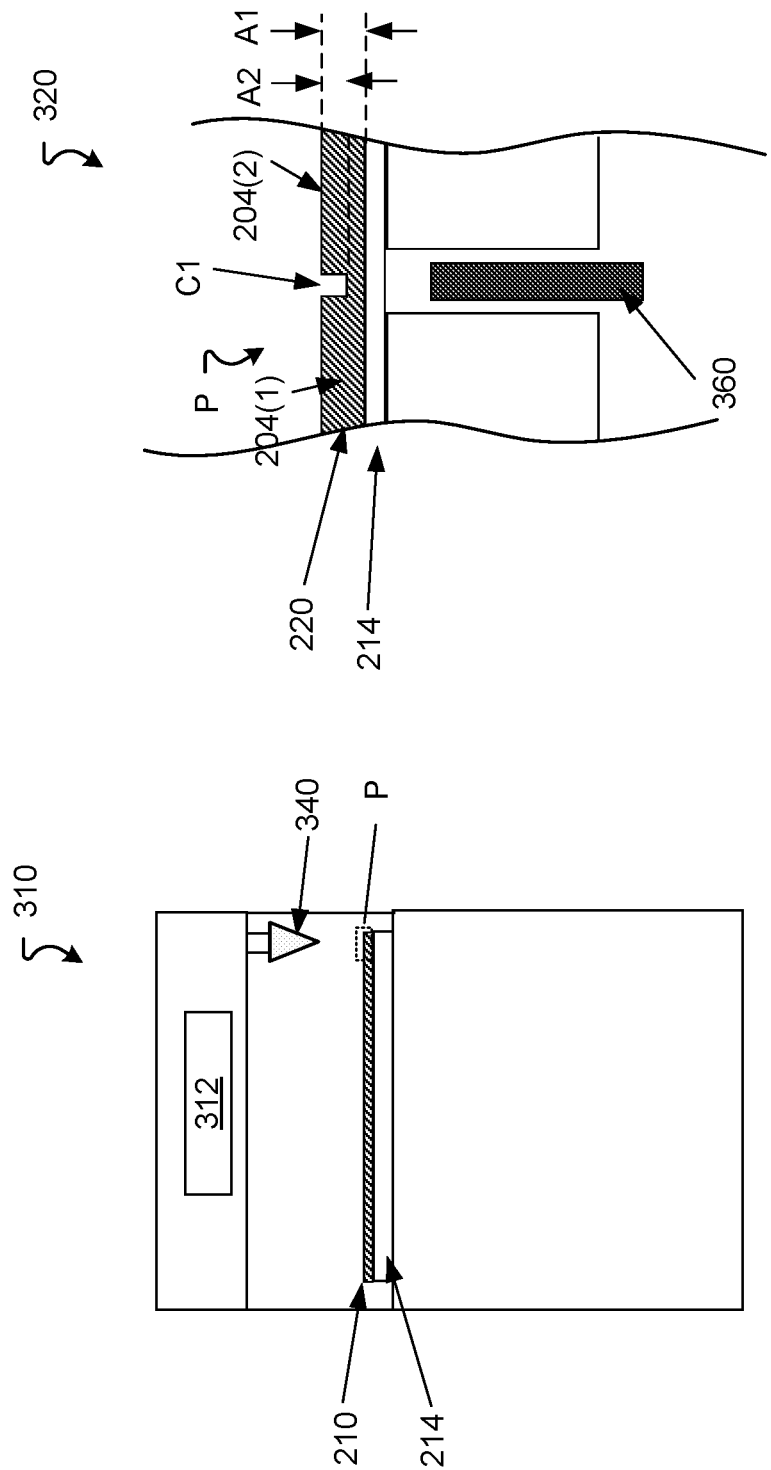

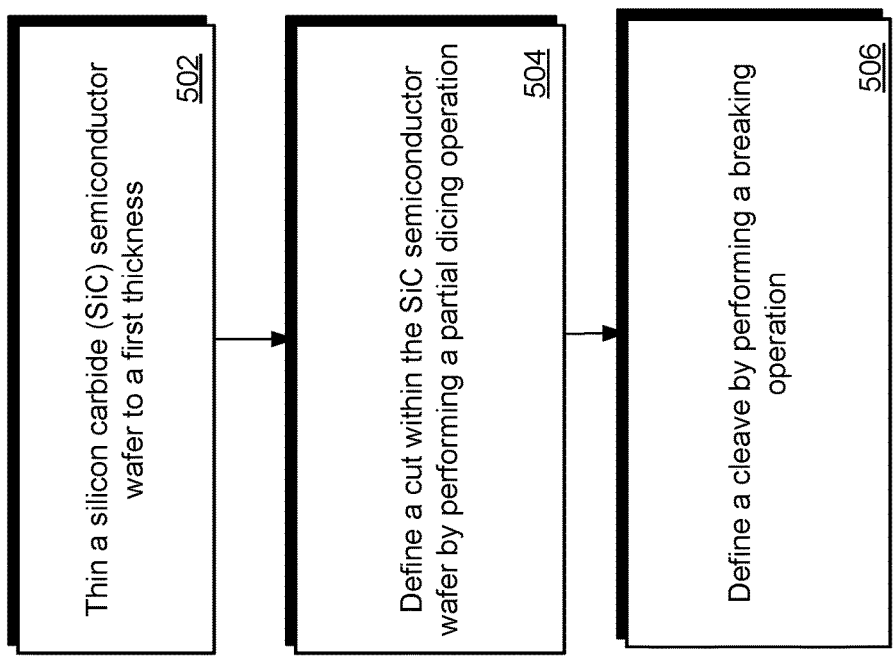

SINGULATION OF SILICON CARBIDE SEMICONDUCTOR WAFERS

CROSS-REFERENCE TO RELATED APPLICATIONS

This application is a divisional of U.S. application Ser. No. 15/974,984, filed May 9, 2018, which is incorporated by reference herein in its entirety.

TECHNICAL FIELD

This description relates to singulation of die from silicon carbide (SiC) semiconductor wafers.

BACKGROUND

Singulation is a process of reducing a semiconductor wafer that includes multiple die of integrated circuits to form individual semiconductor chips. For example, singulation semiconductor die from a silicon wafer may be performed using a water-cooled saw with diamond-tipped teeth. Alternatively, the singulation may be performed using a laser ablation tool.

SUMMARY

In one general aspect, a method of singulating a silicon carbide (SiC) semiconductor wafer can include defining a cut within the silicon carbide (SiC) semiconductor wafer by performing a partial dicing operation where the SiC semiconductor wafer is aligned along a plane and the cut has a depth less than a first thickness of the SiC semiconductor wafer. The cut is aligned along a vertical direction orthogonal to the plane such that a portion of the SiC semiconductor wafer has a second thickness that extends between a bottom of the cut and an outer surface of the SiC semiconductor wafer. The method can further include defining a cleave, by performing a cleaving operation, through the portion of the SiC semiconductor wafer having the second thickness. The cleave can be aligned with the cut and extending to the outer surface of the SiC semiconductor wafer.

In another general aspect, a system can include a wafer chuck, the wafer chuck being configured to receive a SiC semiconductor wafer thinned to a first thickness, the thinned SiC semiconductor wafer having a surface aligned along a plane. The system can also include a dicing apparatus configured to perform a partial dicing operation on the SiC semiconductor wafer to define a cut within the SiC semiconductor wafer, the cut having a depth less than the first thickness of the SiC semiconductor wafer, the cut being aligned along a vertical direction orthogonal to the plane such that a portion of the SiC semiconductor wafer has a second thickness that extends between a bottom of the cut and an outer surface of the SiC semiconductor wafer. The system can further include a cleaving apparatus, the cleaving apparatus being configured to perform a cleaving operation, through the portion of the SiC semiconductor wafer having the second thickness, along the vertical direction to define a cleave, the cleave being aligned with the cut and extending to the outer surface of the SiC semiconductor wafer.

In another general aspect, a method can include thinning a silicon carbide (SiC) a semiconductor wafer to a thickness, the thinned SiC semiconductor wafer having a surface aligned along a plane. The method can also include performing a partial dicing operation on the SiC semiconductor wafer to define a cut in the SiC semiconductor wafer through a first portion of the thickness of the SiC semiconductor wafer, the cut aligned along a vertical direction orthogonal to the plane such that a portion of the SiC semiconductor wafer has a second thickness that extends between a bottom of the cut and an outer surface of the SiC semiconductor wafer, the cut also having a first width in a direction parallel to the plane. The method can further include performing a cleaving operation to define a cleave having a second width less than the first width, the cleave aligned with the vertical cut and through a second portion of the thickness of the SiC semiconductor wafer.

The details of one or more implementations are set forth in the accompa-nying drawings and the description below. Other features will be apparent from the description and drawings, and from the claims.

BRIEF DESCRIPTION OF THE DRAWINGS

FIG. 2A is a diagram that illustrates a cross-sectional view of an example SiC semiconductor wafer after being thinned to a target thickness for singulation.

FIG. 2B is a diagram that illustrates a cross-sectional view of the SiC semiconductor wafer after backmetal deposition.

FIG. 2C is a diagram that illustrates a cross-sectional view of the SiC semiconductor wafer after a partial dicing operation.

FIG. 2D is a diagram that illustrates a cross-sectional view of the SiC semiconductor wafer after a cleaving operation.

FIG. 2E is a diagram that illustrates a cross-sectional view of a portion of an example die of the SiC semiconductor wafer after the cleaving operation.

FIG. 3A is a diagram that illustrates an example cutting apparatus for cutting the SiC semiconductor wafer through a first portion of a thickness of the SiC semiconductor wafer.

FIG. 3B is a diagram that illustrates an example cleaving apparatus for cleaving the SiC semiconductor wafer through a second portion of the thickness of the SiC semiconductor wafer.

FIG. 5 is a flow chart that illustrates an example method of singulating a SiC semiconductor wafer into die according to the improved techniques described herein.

DETAILED DESCRIPTION

The implementations described herein are directed to methods and apparatus for singulation, in a desirable fashion, of semiconductor die from a silicon carbide (SiC) semiconductor wafer. For example, the singulation apparatus and methods described herein can singulate semiconductor die from a SiC semiconductor wafer with vertical sidewall cut profiles through the thickness of the SiC semiconductor wafer. The SiC semiconductor wafer can be referred to as a SiC wafer.

The singulation techniques described herein can include defining a cut within the SiC wafer using a cutting apparatus followed by cleaving of the SiC wafer with a cleaving apparatus. The cut can be defined through only a portion of a thickness of the SiC semiconductor wafer (to a specified depth that is less than an entire thickness of the SiC semiconductor wafer), and the cleaving can be performed through a remaining thickness of the SiC semiconductor wafer.

SiC devices have some advantages over traditional Si devices. For example, SiC has a bandgap that is about three times the bandgap of Si and can withstand far higher voltages and temperatures than Si-based devices. As another example, SiC-based devices having the same dimensions as a Si-based device can withstand approximately 10 times the electric field strength of a SiC-based device. Despite these advantages, the manufacturing techniques applied to SiC wafers cannot be applied in the same way to SiC wafers because SiC wafers have different properties (e.g., have different crystalline structure, is a harder material) than Si wafers. The improved methods and apparatus described herein are directed to processing of the SiC wafers in view of the unique properties of the SiC wafers.

Figure 1B:
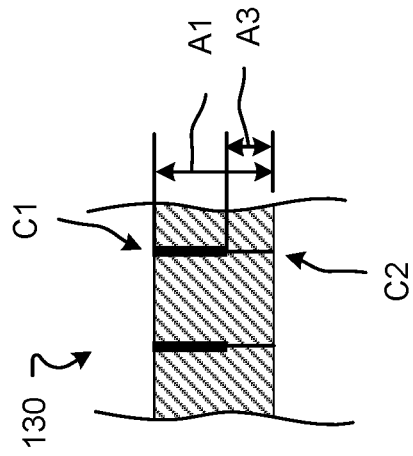
FIGS. 1B and 1C are diagrams that illustrate a portion of a SiC semiconductor wafer that correspondence with the method shown in FIG. 1A.
Figure 1C:
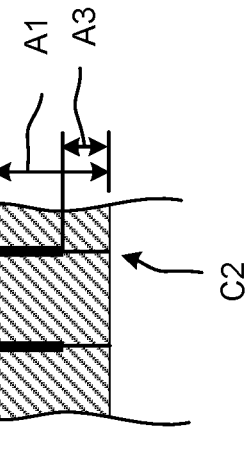
Figure 1A:
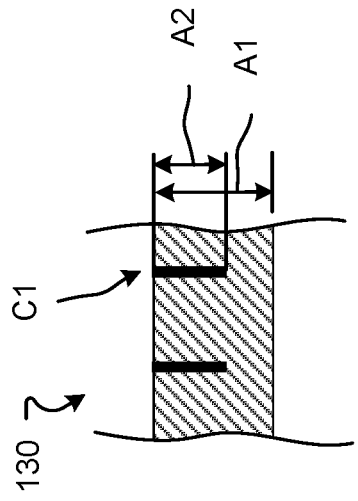
FIG. 1A is a diagram that illustrates an example method for singulating a silicon carbide (SiC) semiconductor wafer into die.

FIG. 1A is a diagram that illustrates an example method of singulating a SiC semiconductor wafer into die. FIGS. 1B and 1C are diagrams that illustrate a portion of a SiC wafer 130 that correspond with the method shown in FIG. 1A.

As shown in FIG. 1A at block 110, a cut is defined within a SiC semiconductor wafer through a portion of the SiC semiconductor wafer. For example, as shown in FIG. 1B, a SiC semiconductor wafer 130 has a cut C1 defined through a portion of a thickness A1 by a cutting apparatus. The depth of the portion of the thickness A1 is denoted in FIG. 1B as A2. As shown in FIG. 1B, the depth A2 is a fraction of the thickness A1. Cutting the SiC wafer through the full thickness A1 may cause undesirable wear on a cutting apparatus.

As also shown in FIG. 1A at block 120, the SiC wafer is cleaved along the cut through a remaining portion of the thickness of the SiC wafer. For example, as shown in FIG. 1C, the SiC semiconductor wafer 130 is cleaved along cleave C2 in addition to being cut along cut C1. The cleave C2 has been added to the SiC semiconductor wafer 130 using a cleaving apparatus. The depth of the remaining portion of the thickness A1 is denoted in FIG. 1C as depth A3. The singulation of the SiC semiconductor wafer 130 in this context is then the combination of a cutting operation that produced the cut C1 and a cleaving operation that produced the cleave C2.

As shown in FIG. 1C, the cleave C2 is aligned with the cut C1 along a vertical axis. Defining the cut C1 and the cleave C2 so that such alignment is achieved is non-obvious in a SiC semiconductor wafer. Performing a cleaving operation in conjunction with a cutting operation results in a vertical separation that is unexpected within a SiC semiconductor wafer. The methods and apparatus under which such alignment of the cut C1 and the cleave C2 is achieved in a SiC semiconductor wafer is further shown and described below.

Advantageously, the improved techniques (cutting and cleaving) reduce wear and tear on equipment use during the singulation process. Because SiC is a hard material (harder than silicon), a cut through a portion of a thickness rather than the entire thickness of a thinned (e.g., post-grinded) wafer may have an advantage of extending the life of cutting equipment used in the singulation process. Extending the life of the cutting apparatus can lower the overall cost of manufacturing the die from a SiC wafer.

FIGS. 2A through 2D are diagrams that illustrate a process by which a SiC semiconductor wafer is singulated into semiconductor die. FIGS. 2A through 2D illustrate more details related to the method shown and described in connection with FIGS. 1A through 1C.

FIG. 2A illustrates thinning (e.g., grinding) of the SiC semiconductor wafer to a thickness, FIG. 2B illustrates backmetal deposition, FIG. 2C illustrates cutting the SiC wafer is cut to a portion of the thickness with a singulation tool, and FIG. 2D illustrates cleaving of the SiC wafer a cleaving tool. The process shown in FIGS. 2A-2D is shown in the order in which they are performed. In some implementations, the process shown in FIGS. 2A-2D is performed in a different order. For example, in some implementations, the backmetal deposition operation shown in FIG. 2B may be performed after the cutting operation shown in FIG. 2C but before the cleaving operation shown in FIG. 2D.

FIG. 2A is a diagram that illustrates an example SiC semiconductor wafer 200 after the SiC semiconductor wafer 200 has been ground to a specified thickness. FIG. 2A shows the SiC semiconductor wafer 200 as positioned in a coordinate system in which x denotes a horizontal direction (i.e., parallel to the surface 202 of the SiC semiconductor wafer 200) and y denotes a vertical direction (i.e., perpendicular to the surface 202 and in the direction of the thickness A1 of the wafer 200). In the implementation shown in FIG. 2A, the SiC semiconductor wafer 200 is disposed on a chuck 206 as the SiC wafer 200 is being thinned. During the thinning (e.g., grinding) process, at least some portion of the SiC wafer 200 is removed to reduce the thickness of the SiC wafer 200.

In some implementations, the thickness A1 of the SiC semiconductor wafer 200 is several hundred microns (m) (e.g., 250 µm, 300 µm, 500 µm). The thinning process illustrated in FIG. 2A is also configured to provide an essentially flat surface 202. In some implementations, for example, the flatness of the surface 202 is within 1 µm and the surface roughness is less than 0.5 nm.

Also shown in FIG. 2A are die sections of the SiC semiconductor wafer 200, including die sections 204(1) and 204(2). As shown in FIG. 2A, the die sections have boundaries represented by dashed lines. Each die section represents a die after the singulation process has been completed. The boundaries between the die sections have a finite width to take into account the finite widths of the cut C1 and the cleave C2 used to produce separated dies. Each die section also has a boundary region known as a kerf. In some implementations, the kerf includes, for example, test and/or alignment patterns. In some implementations, each of the die sections is rectangular. In some implementations, each of the die sections has dimensions of about 10 mm×10 mm. In some implementations, each of the die sections has a smaller size (e.g., 5 mm×5 mm) or a larger size (e.g., 26 mm×32 mm).

FIG. 2B is a diagram that illustrates an example SiC semiconductor wafer 210 after a backmetal deposition operation has been performed to produce a backmetal 214 that is coupled to (e.g., adheres) to the backside of the wafer 210. In some implementations, the backmetal 214 deposited on the backside of the wafer 210 includes a film stack that includes silver, nickel, and/or tin. In some implementations, the thickness of each layer of the film stack is between 1.5 µm and 2.0 µm. In some implementations, the layers of the stack may include tantalum, copper, and/or aluminum.

FIG. 2C is a diagram that illustrates an example SiC semiconductor wafer 220 after a cutting operation performed by a cutting tool to produce a cut C1 in between die sections 204(1) and 204(2). As shown in FIG. 2C, the cut C1 is vertical (e.g., substantially vertical, aligned along direction y) and has a depth A2 that is a portion of the thickness A1 of the SiC semiconductor wafer 220.

In some implementations, the cut C1 has a width that can be determined by a specified width of kerfs of the die section separated by the cut C1. In some implementations, the width of the cut C1 can be a few microns (e.g., 2 µm, 5 µm). In some implementations, the width of the cut C1 can be more than a few microns (e.g., between 20 µm to 50 µm). Also shown in FIG. 2C is the backmetal 214 deposited on the backside of the wafer 220.

In some implementations, the cut C1 has a uniform cross-section through the portion A2 even though the cut C1 is still aligned with the vertical direction. In some implementations, the cut C1 has a nonuniform cross-section (e.g., a tapered cross-section, a bulging cross-section, and the like). For example, when a cutting apparatus (see apparatus 310 in FIG. 3A) includes a laser ablation tool, the distribution of laser light irradiance (i.e., energy density) through the portion A2 may vary with the vertical direction because the distribution of light for a tightly focused beam varies through the direction of propagation of the light.

FIG. 2D is a diagram illustrating an example wafer 230 after both the cutting operation and cleaving operation have been performed. Shown in FIG. 2D are the cut C1 resulting from a cutting operation and a cleave C2 resulting from a cleaving operation that are both aligned with respect to the vertical (y) axis. As shown in FIG. 2D, the cut C1 is aligned with the cleave C2. As shown in FIG. 2D, the cleave C2 extends from the cut C1.

As shown in FIG. 2D, the cleave C2 has a smaller width than the cut C1. In some implementations, the cut C1 can have a width that is more than 5 times a width of the cleave C2. For example, in some implementations, the cut C1 can have a width between 20 µm to 50 µm, and the cleave C2 has a width of between 3 µm to 5 µm. This difference between the widths of the cut C1 and the cleave C2 is discussed in further detail with respect to at least FIG. 2E.

In some implementations, the cut C1 has a uniform cross-section (e.g., profile) along the depth A2 of the cut C1. For example, sidewalls of the cut C1 can be vertical and parallel between die sections 204(1) and 204(2). In some implementations, the cut C1 has a nonuniform cross-section along the depth A2 of the cut C2 (e.g., a tapered cross-section and the like resulting from the cleaving operation).

In some implementations, the cleave C2 has a uniform cross-section (e.g., profile) along the depth A3 of the cleave C2. For example, sidewalls of the cleave C2 between can be vertical and parallel between die sections 204(1) and 204(2). In some implementations, the cleave C2 has a nonuniform cross-section along the depth A3 of the cleave C2 (e.g., a tapered cross-section and the like resulting from the cleaving operation).

FIG. 2E is a diagram illustrating enlarged example view of die 254(1) and 254(2) (corresponding to die sections 204(1) and 204(2)) resulting from the process illustrated in FIGS. 2A-2D. As mentioned above, the cut has a larger width W1 than the width of the cleave W2. Accordingly, a gap W3 (e.g., a step) having width about equal to (W1−W2)/2. The gap W3 results in a step in the die 254(1) of width (W1−W2)/2. As shown in FIG. 2E, the sidewall associated with the cut is vertical (e.g., substantially vertical) and the sidewall associated with the cleave is vertical (e.g., substantially vertical).

FIG. 2E illustrates an example cross-sectional shape (e.g., profile) of a cut and a cleave, however, the cut and the cleave can have different cross-sectional shapes). For example, in some implementations, the sidewall of a cut can be aligned within a same plane as a sidewall of a cleave (instead of being offset as shown in FIG. 2E).

FIGS. 3A and 3B are diagrams that illustrate an example system for performing singulation of die from a SiC semiconductor wafer 130. The system includes a cutting apparatus 310 for performing a cutting operation on a portion of a SiC semiconductor wafer 210. The system also includes a cleaving apparatus 320 for performing a cleaving operation on the SiC semiconductor wafer 220 after the cutting operation has been performed. The result of the cutting operation and the subsequent cleaving operation, when performed according to the improved techniques described herein, is a set of SiC semiconductor dies having vertical sidewalls (e.g., substantially vertical sidewalls).

As shown in FIG. 3A, the cutting apparatus 310 is configured to perform a cutting operation between the die sections of the SiC semiconductor wafer 210 to produce a set of cuts (e.g., cut C1 in FIGS. 2A-2D) through a portion of the thickness of the SiC semiconductor wafer 130. As shown in FIG. 3A, the cutting apparatus 310 includes a controller 312 configured to control a cutting tool 340 for performing the cutting operation.

The cutting tool 340 is configured to cut the SiC semiconductor wafer 210 between die sections. In some implementations, the cutting tool 340 includes a mechanical saw blade. In some implementations, the saw blade is a nickel bond dicing blade. In some implementations, the saw blade is a hubbed or hubless resinoid blade. In some implementations, the saw blade is a metal sintered dicing blade. In some implementations, the saw blade is configured to produce cut widths of between about 15 µm and 75 µm.

In some implementations, the cutting tool 340 includes a laser ablation tool. Such a laser ablation tool performs a scribing operation to produce a cut through a portion of the thickness of the SiC semiconductor wafer 210 between the die sections. In some implementations, the cutting tool 340 includes a short-pulse laser and a focusing lens. The laser can be of any wavelength although it is advantageous that the laser has a short wavelength (e.g., a UV wavelength less than 400 nm). In some implementations, the laser ablation tool can produce cut widths between 10 µm and 50 µm.

The controller 312 is configured to control the cutting tool 340 such that a cut produced by the cutting tool 340 has a specified depth through a portion of the thickness of the SiC semiconductor wafer 210 and a specified width in the gap between the die sections. In some implementations, the controller 312 includes an electronic control component configured to move the cutting tool 340 over the SiC semiconductor wafer 210 according to a dwell schedule. In some implementations, when the cutting tool includes a mechanical saw blade, the electronic component is configured to position the saw blade along an axis normal to the surface of the SiC semiconductor wafer 210 such that the saw blade performs the cutting operation at a portion of the thickness of the SiC semiconductor wafer 210. In some implementations, the controller 312 has a mechanical component configured to position the saw blade along the axis normal to the surface of the SiC semiconductor wafer 210. In some implementations, when the cutting tool 340 includes a laser ablation tool, the controller 312 includes an electronic control component configured to adjust a power of the laser and/or a number of passes across the SiC semiconductor wafer 210 to produce a cut having a specified depth through the thickness of the SiC semiconductor wafer 210 and/or width. In some implementations, the electronic control component is configured to adjust a position of the focusing lens to produce the cut having a specified depth through the thickness of the SiC semiconductor wafer 210.

Once the cutting operation has been performed by the cutting apparatus 310, the SiC semiconductor wafer 210 becomes the cut semiconductor wafer 220 and the cut SiC semiconductor wafer 220 is transferred to the cleaving apparatus 320. In some implementations, the transfer of the wafer 220 from the cutting apparatus 310 to the cleaving apparatus 320 is performed by a robotic wafer transfer device having an end effector that is magnetically attached to the wafer 210 during the transfer.

As shown in FIG. 3B, the cleaving apparatus 320 is configured to perform a cleaving operation on the cut SiC semiconductor wafer 220 after the cutting operation has been performed on the SiC semiconductor wafer 210 to produce a cleave that results in separated die. As shown in FIG. 3B, the cleaving apparatus 320 includes, for example, an impulse bar 360 configured to cleave the wafer 220 at a specified location below the cut C1.

The cleaving operation is made possible when the cut C1 creates a stress concentration factor in the gap separating the die sections 204(1) and 204(2) of the wafer 220. The cleaving operation causes the impulse bar 360 to cleave through the portion of the thickness of the cut SiC semiconductor wafer 220 below the cut upon an application of force by the impulse bar 360. In some implementations, the pressure applied to the cut SiC semiconductor wafer 220 by the impulse bar can be between 300 kPa and 350 kPA. In some implementation, the pressure applied can be greater than 350 kPA or less than 300 kPa. In some implementations, such pressure is applied to the SiC semiconductor wafer 220 when the distance that the impulse bar 360 travels can be between 80 µm and 100 µm. In some implementation, the distance that the impulse bar 360 travels can be greater than 100 µm or less than 80 µm. In some implementations, the cleaving operation is performed by static bending, an anvil method, or a non-contact method that uses a vacuum chuck.

In some implementations, the cleave produced by the cleaving operation is aligned with the cut produced by the cutting operation performed by the cutting apparatus 310. As is discussed in greater detail with respect to FIG. 4A, this alignment depends on the portion A2 of the thickness A1 through which the cut is made.

Figure 4A:
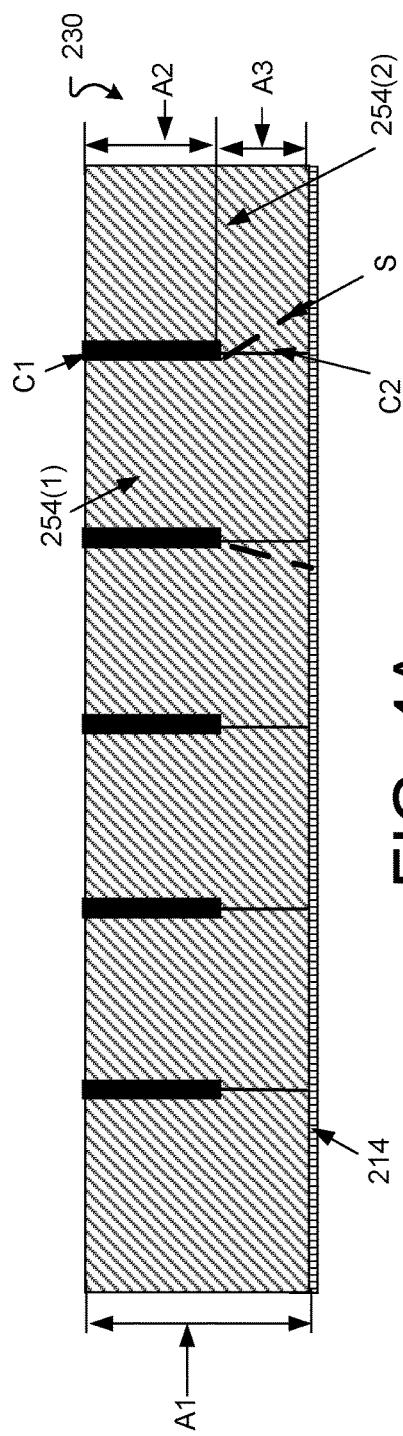
FIG. 4A is a diagram that illustrates an example cut and cleaved SiC semiconductor wafer.

FIG. 4A is a diagram illustrating the SiC semiconductor wafer 230 that has been diced into the die 254(1) and 254(2) according to the improved techniques described above. As shown in FIG. 3A, the SiC semiconductor wafer 230 has a cut C1 and a cleave C2 that results in a set of die, for example die 254(1) and 254(2). The cut C1 has a depth A2 that is a portion of the thickness A1 of the SiC semiconductor wafer 230, the cleave C2 is aligned with the cut C2 and both the cut C1 and cleave C2 are aligned along a vertical direction (e.g., substantially vertical direction).

The depth A2 of cut C1 into the thickness A1 of the wafer 230 extends is formed (e.g., made) so that a subsequent cleave produces a cleave C2 that is aligned with (e.g., aligned along the same direction, parallel to) the cut C1. Such an alignment of the cleave C2 with the cut C1 occurs when the portion A2 is at least 65% of the thickness A1 of the SiC wafer 230. In some implementations, the portion A2 is preferably between about 65% and 75% of the thickness A1 of the SiC wafer 230. In some implementations, the ratio of the portion A2 to the portion A3 is between about 2 and 3.

As described above, the situation illustrated in FIG. 4A with the cut C1 and cleave C2 both aligned with respect to the vertical (y) axis occurs when the portion A2 of the thickness A1 of the cut C1 is about 65-75% of the thickness A1. If the portion A1 is less than 65% of A1, then the resulting cleave S may not be aligned with the y axis and the cut C1 but may rather be situated at a skewed angle with respect to the y axis. Such a skewed angle is not desirable because the die that result may not provide a properly operating device when in a module. When the portion is greater than 75%, the wear on the singulation tool used to perform the cutting operation may be too great to be economically viable in some applications.

Figure 4B:
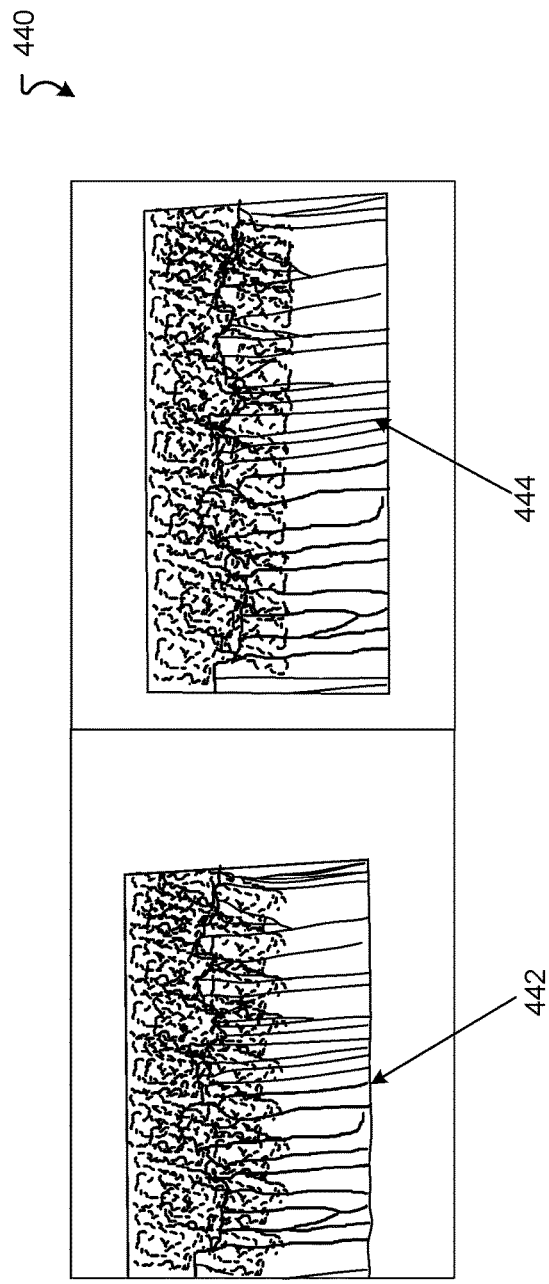
FIG. 4B is a diagram that illustrates a line drawing of a scanning electron microscope (SEM) picture of the example cut and cleaved SiC semiconductor wafer.

FIG. 4B is a line drawing that shows this aligned cut and cleave in scanning electron microscope (SEM) pictures 442 and 444. SEM picture 442 shows a first die (e.g., die 254(1)) and the SEM picture 444 shows another die (e.g., die 254(2)). As shown in the SEM pictures 442 and 444, the die resulting from the cut and cleave, as described above, have vertical sidewalls.

FIG. 5 is a flow chart illustrating a method 500 of performing a singulation of a SiC semiconductor wafer according to the improved techniques described above.

At 502, a SiC semiconductor wafer (e.g., the wafer 200 of FIG. 2A) is thinned (e.g., grinded) to a first thickness (e.g., thickness A1). A surface of the thinned SiC semiconductor wafer is aligned along a plane (e.g., surface 202 is aligned in the x-direction).

At 504, a cut is defined within the SiC semiconductor wafer by performing a partial dicing operation (e.g., cut C1 of FIG. 2C). The cut has a depth less than the first thickness to which the SiC semiconductor wafer is ground (e.g., portion A2). The cut is aligned along a vertical direction orthogonal to the plane (e.g., the cut C1 is aligned in the y-direction of FIG. 2D), the cut aligned such that a portion of the SiC semiconductor wafer has a second thickness that extends between a bottom of the cut and an outer surface of the SiC semiconductor wafer.

At 506, a cleave is defined by performing a cleaving operation, through the portion of the SiC semiconductor wafer having the second thickness, along the vertical direction (e.g., cleave C2 of FIG. 2D). The cleave is aligned with the cut and extending to the outer surface of the SiC semiconductor wafer.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A system, comprising:
   a wafer chuck, the wafer chuck being configured to receive a silicon carbide (SiC) semiconductor wafer thinned to a first thickness to produce a thinned SiC semiconductor wafer, a first surface of the thinned SiC semiconductor wafer being aligned along a plane;
   a dicing apparatus configured to perform a partial dicing operation on the first surface of the thinned SiC semiconductor wafer to define a cut within the thinned SiC semiconductor wafer to produce a partially diced SiC semiconductor wafer, the cut having a depth less than the first thickness of the thinned SiC semiconductor wafer, the cut being aligned along a vertical direction orthogonal to the plane, the cut being aligned such that a portion of the thinned SiC semiconductor wafer has a second thickness that extends between a bottom of the cut and a second surface of the thinned SiC semiconductor wafer, the second surface being opposite the first surface; and
   a cleaving apparatus, the cleaving apparatus being configured to perform a cleaving operation on the second surface of the partially diced SiC semiconductor wafer, through the portion of the partially diced SiC semiconductor wafer having the second thickness, along the vertical direction to define a cleave, the cleave being aligned with the cut and extending to the second surface of the partially diced SiC semiconductor wafer.

2. The system of claim 1, wherein the depth is between 65% and 75% of the first thickness of the thinned SiC semiconductor wafer.

3. The system of claim 1, wherein the cut has a first width in a direction parallel to the plane and the cleave has a second width in the direction parallel to the plane, the first width being greater than the second width, and
   the cut and the cleave are used to define a set of SiC die, each of the set of SiC die having a step, the step having a width in the direction parallel to the plane based on a difference between the first width and the second width.

4. The system of claim 1, further comprising:
   a backmetal deposition apparatus, the backmetal deposition apparatus being configured to perform a backmetal deposition operation on the partially diced SiC semiconductor wafer prior to performing the cleaving operation.

5. The system of claim 1, wherein performing the cleaving operation includes:
   applying a cleaving force to the partially diced SiC semiconductor wafer along the cut using an impulse bar.

6. The system of claim 1, wherein the dicing apparatus includes a laser ablation tool, the dicing apparatus configured to cut through the thinned SiC semiconductor wafer at the depth, a power of the laser ablation tool being defined to enable the laser ablation tool to define the cut having the depth.

7. The system of claim 1, wherein the dicing apparatus includes a mechanical saw tool, the mechanical saw tool configured to cut through the thinned SiC semiconductor wafer at the depth, the mechanical saw tool including a saw blade having a position to define the cut at the depth.

8. The system of claim 1, further comprising:
   an automated transfer device having an end effector, the end effector being configured to apply a transfer force to the partially diced SiC semiconductor wafer to transfer the partially diced SiC semiconductor wafer from the dicing apparatus to the cleaving apparatus, the transfer force being based on the depth.

9. A system configured to separate a die in a silicon carbide (SiC) semiconductor wafer, comprising:
   a cutting apparatus including:
      a cutting tool configured to perform a cutting operation on a first surface of the SiC semiconductor wafer in a gap between die sections to produce a cut that results in a cut SiC semiconductor wafer; and
      a controller configured to control the cutting tool such that the cut produced by the cutting tool has a specified depth through a portion of a thickness of the SiC semiconductor wafer and a specified width in the gap between the die sections; and a cleaving apparatus configured to perform a cleaving operation on the cut SiC semiconductor wafer on a second surface of the SiC semiconductor wafer after the cutting operation has been performed on the SiC semiconductor wafer to produce a cleave that results in a separated die, the second surface being opposite the first surface.

10. The system as in claim 9, wherein the controller includes an electronic component configured to move the cutting tool over the SiC semiconductor wafer according to a dwell schedule.

11. The system as in claim 9, wherein the cutting tool includes a mechanical saw blade.

12. The system as in claim 11, wherein the mechanical saw blade is one of a nickel bond dicing blade, a hubless resinoid blade, a hubbed resinoid blade, or a metal sintered dicing blade.

13. The system as in claim 11, wherein the controller includes an electronic control component configured to position the mechanical saw blade along an axis normal to the first surface of the SiC semiconductor wafer such that the mechanical saw blade performs the cutting operation on the first surface of the SiC semiconductor wafer at the portion of the thickness of the SiC semiconductor wafer.

14. The system as in claim 9, wherein the cutting tool includes a laser ablation tool, and wherein the cutting operation includes a scribing operation performed by the laser ablation tool to produce the cut through a portion of the thickness of the SiC semiconductor wafer between the die sections.

15. The system as in claim 14, wherein the laser ablation tool includes a short-pulse laser and a focusing lens.

16. The system as in claim 15, wherein the short-pulse laser has a wavelength of less than 400 nm.

17. The system as in claim 15, wherein the controller includes an electronic control component configured to adjust a power of the short-pulse laser to produce a cut having a specified depth through the thickness of the SiC semiconductor wafer.

18. The system as in claim 15, wherein the controller includes an electronic control component configured to adjust a position of the focusing lens to produce the cut having the specified depth through the thickness of the SiC semiconductor wafer.

19. The system as in claim 9, wherein the controller includes an electronic control component configured to adjust a number of passes across the SiC semiconductor wafer to produce the cut having the specified width in the gap between the die sections.

20. The system as in claim 9, wherein the cleaving apparatus includes an impulse bar configured to cleave the perform the cleaving operation on the SiC semiconductor wafer at a specified location on the second surface of the SiC semiconductor wafer.

* * * * *

UNITED STATES PATENT AND TRADEMARK OFFICE
CERTIFICATE OF CORRECTION

| | | |
|---|---|---|
| PATENT NO. | : 11,942,327 B2 | Page 1 of 1 |
| APPLICATION NO. | : 17/659388 | |
| DATED | : March 26, 2024 | |
| INVENTOR(S) | : Aira Lourdes Villamor | |

It is certified that error appears in the above-identified patent and that said Letters Patent is hereby corrected as shown below:

In the Specification

In Column 3, Line 14, delete "SiC" and insert -- Si --, therefor.

Signed and Sealed this
Twenty-second Day of October, 2024

Katherine Kelly Vidal
*Director of the United States Patent and Trademark Office*